United States Patent [19]

Mena et al.

[11] Patent Number: 4,922,327

[45] Date of Patent: May 1, 1990

[54] SEMICONDUCTOR LDMOS DEVICE WITH UPPER AND LOWER PASSAGES

[75] Inventors: José G. Mena, Wyomissing, Pa.; C. Andre T. Salama, Toronto, Canada

[73] Assignee: University of Toronto Innovations Foundation, Toronto, Canada

[21] Appl. No.: 137,882

[22] Filed: Dec. 24, 1987

[51] Int. Cl.[5] ............................................. H01L 29/78
[52] U.S. Cl. .................................. 357/23.4; 357/23.1; 357/23.8
[58] Field of Search ..................... 357/23.4, 23.8, 23.1

[56] References Cited

U.S. PATENT DOCUMENTS 4,599,118 7/1986 Han et al. ...................... 357/23.4 X

FOREIGN PATENT DOCUMENTS 55-52272 4/1980 Japan ................................... 357/23.4

OTHER PUBLICATIONS

Cauge et al., "Double-Diffused MOS Transistor Achieves Microwave Gain", *Electronics*, vol. 44, No. 4, Feb. 15, 1971, pp. 99–104.
Fong, "Power DMOS for High-Frequency and Switching Applications," *IEEE Transactions on Electron Devices*, vol. ED-27, No. 2, Feb. 1980, pp. 322–330.
Sai-Halasz, "Simple Realization of an Edge-Doped FET," *IBM Technical Disclosure Bulletin*, vol. 26, No. 6, Nov. 1983, pp. 3025–3026.

*Primary Examiner*—William Mintel
*Attorney, Agent, or Firm*—Bert J. Lewen; Henry Sternberg

[57] ABSTRACT

A semiconducting device and method of making the same are provided. The semiconducting device is provided with a gate, a source and a drain disposed on one side of a current carrying layer and a substrate formed from one type of semiconducting material disposed on the other side thereof. The current carrying layer includes a bulk region formed from said one type of semiconducting material and a drift region formed from the opposite type of semiconducting material, the bulk and the drift regions of which form a pn junction. The drift region includes a pair of parallel passages, one passage of which has a lower doping concentration than the other. The bulk region includes a first and a second portion, the first portion of which isolates the second portion from the other passage and has a lower doping concentration than the second portion and the one passage. The one passage is also extended so as to isolate the bulk region from the substrate. Source and drain regions located on opposite sides of the junction are also provided and formed from the opposite type of semiconducting material. The source and drain regions are doped to have a higher doping concentration than the other passage. Thus, the semiconducting device maintains a relatively high breakdown voltage whilst exhibiting a low on-resistance.

11 Claims, 8 Drawing Sheets

| PARAMETERS | RUN 1 (OPTIMIZED) | | RUN 2 | |
|---|---|---|---|---|
| | PRESENT DEVICE | THEORETICAL RESULTS | PRESENT DEVICE | THEORETICAL RESULTS |
| BREAKDOWN VOLTAGE (VOLTS) | 460 ± 10 | 440 | 425 ± 5 | 430 |
| THRESHOLD VOLTAGE (VOLTS) | 0.9 ± 0.3 | 1.2 | 0.8 ± 0.2 | 1.1 |
| ON-RESISTANCE VOLTAGE (VOLTS) | 17.2 ± 0.6 | 16.4 | 17.7 ± 0.7 | 16.6 |

SEMICONDUCTOR LDMOS DEVICE WITH UPPER AND LOWER PASSAGES

The present invention relates to a semiconducting device and the technique for forming the same, and in particular to a lateral double diffused metal oxide semiconductor transistor.

Lateral double diffused metal oxide semiconductor transistors (LDMOS) are well known devices which form an integral part of modern display panels, telecommunications systems, motor controllers, switch lock power supplies, inverters and the like when functioning as high voltage drivers. The high voltage characteristics associated with these applications requires that the LDMOS devices have the capability of withstanding supply voltages in excess of 450 volts without exhibiting breakdown. Furthermore, it is desired for LDMOS devices to have a low on-resistance to reduce the power consumption dissipated in the form of heat and to increase current handling capabilities without lowering the breakdown voltage characteristics thereof. More importantly, it is desirable that the driver threshold voltage required to operate the LDMOS device be maintained at a level corresponding to the typical operating voltages of integrated circuits, thereby allowing these devices to be compatible with JFET's, bi-polar transistors and thyristors.

However, a problem exists in conventional LDMOS devices in that when attempting to increase the breakdown voltage whilst maintaining the threshold voltage, the on-resistance of the device increases. Furthermore, another problem exists in that the technique of fabricating these devices does not allow the breakdown voltage to be controlled accurately. Thus, there is a need for a semiconducting device having a low on-resistance and a high controllable breakdown voltage whilst maintaining a low driver threshold voltage.

It is therefore an object of the present invention to obviate or mitigate the above disadvantages by providing a novel semiconducting device.

According to the present invention there is provided a semiconducting device having source and drain nodes located on opposite sides of a gate node. The source, gate and drain nodes are disposed on one side of a semiconducting layer whilst an insulation layer is disposed on the other side of the semiconducting layer. The semiconducting layer includes a channel region having a pair of zones which is located adjacent the gate node and is formed from one conductivity type of semiconductive material. A drift region formed from the opposite conductivity type of semiconductive material is included in the semiconducting layer. The drift region is defined by a pair of parallel passages, one passage of which has a lower doping concentration than the other. Each of the zones in the channel region is located adjacent one of the passages to define a pair of pn junctions. The doping concentration of the two zones are chosen so that the breakdown voltage of each pn junction is substantially identical. Source and drain regions formed from the opposite conductivity type of semiconductive material are provided in the layer adjacent their respective node and have a higher doping concentration than the other passage.

An embodiment of the invention will now be described by way of example only with reference to the accompanying drawing in which.

Figure 1:
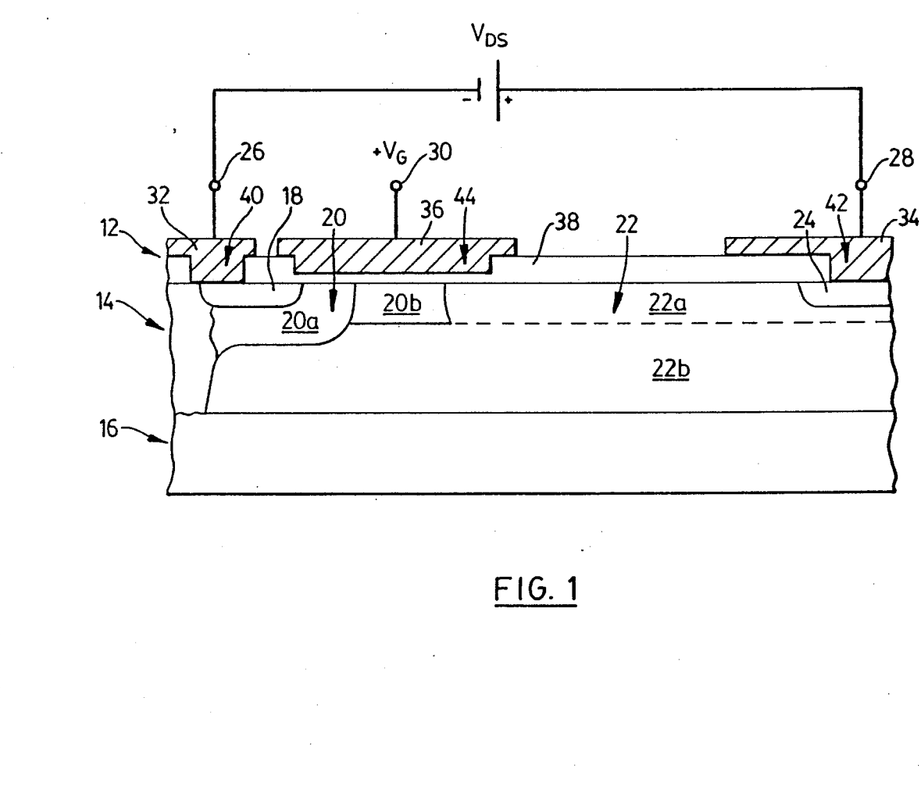
FIG. 1 is a cross-sectional view of a metal oxide semiconducting device.

Referring to FIG. 1, a metal oxide semiconducting device 10 is shown having an input layer 12, a semiconducting layer 14 and a substrate 16. Input layer 12, disposed on one side of semiconducting layer 14, provides access for the power supplies to the semiconducting device. Substrate 16 is located on the other side of semiconducting layer 14 and serves as a growth medium therefor. Semiconducting layer 14 includes four regions, namely a source or majority carrier entrance region 18, a channel region 20, a drift region 22 and a drain or majority carrier exit region 24, each region of which allows majority carriers to pass, and hence a current to flow therethrough.

Associated with the input layer 12 is a source terminal 26, a drain terminal 28 and a gate terminal 30, each of which is connected to a corresponding metal oxide layer 32, 34 and 36. Also situated in the input layer 12, is a silicon oxide layer 38 having two windows 40 and 42 provided therein, thereby permitting metal oxide layers 32 and 34 to contact the current carrying layer 14. Recess 44 is also provided in silicon oxide layer 38 which permits metal oxide layer 36 to be seated securely thereon and insulated from the semiconducting layer 14 by a predetermined distance.

Semiconducting layer 14 and substrate 16 are formed from regions of n-type material and p-type material. However, the regions of p-type and n-type material located therein vary in resistivity due to the amount of doping present in the material. For the sake of clarity of description, semiconductive material having donor or n-type impurities (excess electron carriers) that is more highly doped and therefore has a lower resistivity than n-type material shall be referred to as $n^+$-type material and material that is lower doped and therefore has a higher resistivity than n-type material shall be referred to as $n^-$-type material. Similarly, semiconductive material having acceptor or p-type impurities (excess hole carriers) with high, low and medium doping, shall now be referred to as p+-type, p⁻-type and p-type material respectively.

The substrate layer 16 is formed from p⁻-type material and serves as both a growth medium and a protection layer for the semiconducting layer 14.

In the semiconducting layer 14, drain region 24 is formed from n+-type material and provides a conductive contact with metal oxide layer 34. Similarly, source region 18 is formed from n+-type material and provides a conductive contact with metal oxide layer 32. Located between the source and drain regions 18 and 24 are the channel and drift regions 20 and 22, respectively, which define a pn junction and form a switchable semiconductive path for majority carriers passing between the source and drain regions.

Channel region 20 formed near the source region includes two portions 20a and 20b, the first portion 20a of which is formed from p-type material and the second portion 20b of which is formed from p⁻-type material. Extending from the channel region 20 to the drain region 24 is drift region 22 which includes two elongate parallel conducting passages 22a and 22b formed from n-type and n⁻-type material respectively.

Although the channel region 20 and drift region 22 form in general a pn junction beneath the gate metal oxide layer 36, the relative doping concentrations within the two regions provides two types of junctions, namely a p⁻n and a pn⁻ junction with differing characteristics.

In operation of the semiconducting device 10, a positive potential voltage $V_{DS}$ is applied across the drain and source terminals 28 and 26, respectively, and a positive voltage $V_G$ is applied to the gate terminal 30. The gate voltage $V_G$ creates an electric field in the metal oxide layer 36, however only a small gate current develops due to the insulating silicon oxide layer 38. The electric field developed in the oxide layer 36 causes the electrons in the channel region 20 to be pulled towards the gate terminal and the holes therein to be pushed towards the substrate, thereby forming an n-type material inversion layer in the channel region 20. Thus, an n-type layer is formed in the p-type and p⁻-type channel region portions 20a and 20b, respectively, to provide an n-type material conduction path from the source region 18 to the drift region 22 for the movement of majority carriers. With the potential voltage $V_{DS}$ applied across the drain and source terminals 28 and 26, majority carriers move from the source to the drain thereby resulting in a current flow $I_D$ through the device.

As the gate voltage $V_G$ is increased, the size of the inversion layer increases and thus, the current flow $I_D$ through the device increases. If the gate voltage $V_G$ is maintained at a fixed value and the drain to source voltage $V_{DS}$ is increased, the current $I_D$ begins to increase linearly for a certain range and then levels off until breakdown is achieved. When breakdown occurs the drain current $I_D$ increases dramatically and the semiconducting device can be seriously damaged due to the high currents associated therewith. As should be appreciated, the operation of the present device is similar to the conventional LDMOS devices. However, the configuration of the present device allows the operable parameters, i.e. breakdown voltage, on-resistance and threshold voltage to be optimized, as will be described hereinafter.

Figure 8A:
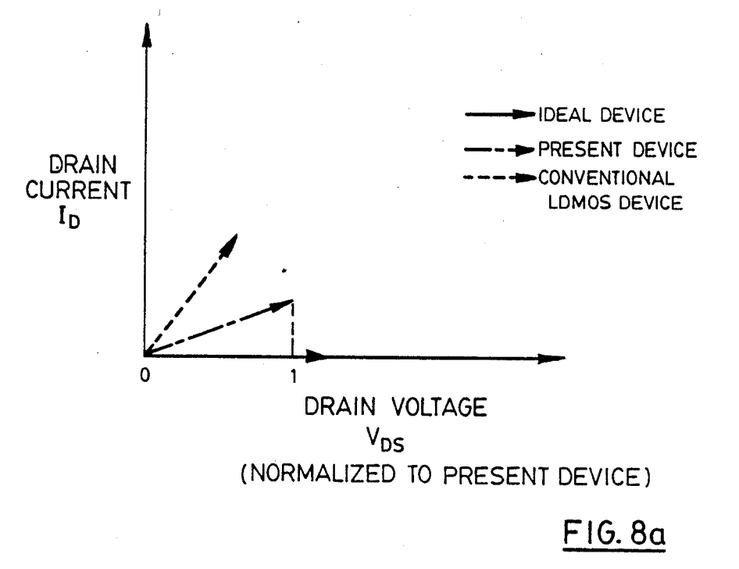
FIG. 8a and 8b are performance curves for a number of semiconducting devices.
Figure 8B:
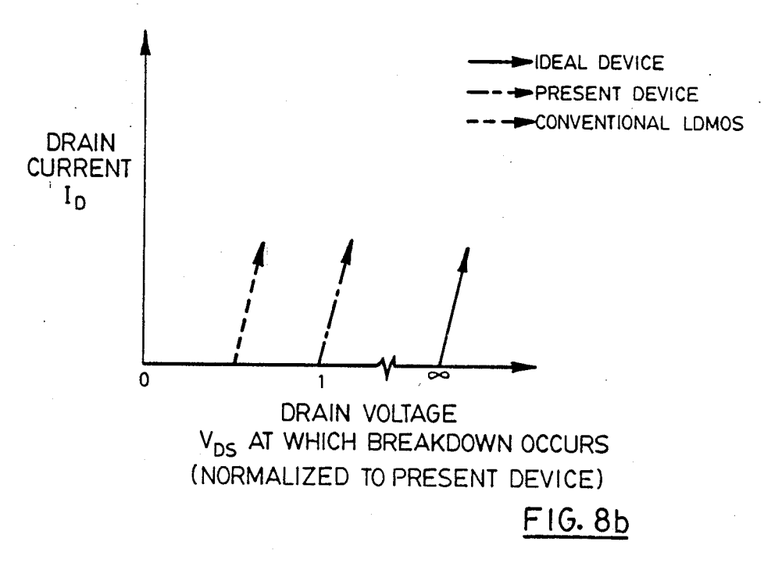

Referring now to FIGS. 8a and 8b, breakdown voltage BV and on-resistance $R_{on}$ characteristics are shown for an ideal high voltage semiconducting device, a conventional LDMOS device and the present semiconducting device 10. In this example, the LDMOS device characteristics are being compared with the present device characteristics for a semiconducting device 10 manufactured similarly to the conventional LDMOS device with the provision of the parallel passage 22a in the drift region 22 and the portion 20b in the channel region 20. As can be seen from the ideal semiconductor transistor characteristics, it is desirable for the semiconducting devices to exhibit zero on-resistance whilst maintaining an infinite breakdown voltage. The conventional LDMOS device as illustrated exhibits a non-zero on-resistance and a finite breakdown voltage. However, the present device manufactured in a similar manner as mentioned previously exhibits a lower on-resistance and a higher finite breakdown voltage thereby improving performance of the device by exhibiting characteristics closer to the ideal values.

To maintain the high breakdown voltage BV, a high resistance drift region is required, but such a high resistance drift region in a conventional LDMOS device results in a large on-resistance. In the present device 10 to reduce the on-resistance, a lower resistance n-type material passage 22a is placed in parallel with the high resistance n⁻-type material passage 22b thereby defining the drift region 22. Thus, in operation the current $I_D$ flowing through the drift region 22 flows mostly in the lower resistance passage 22a near the surface thereof thereby reducing the effective resistance of drift region 22. The low breakdown voltage $B_V$ normally exhibited by the use of an n-type passage is obviated by the provision of the p⁻type material portion 20b located between the p-type and n-type material at regions 20a, 22a respectively. This is due to the fact that the breakdown voltage $B_V$ is determined by the most lightly doped side of the pn junction which, in the present embodiment, is selected to be the p⁻-type material portion 20b of region 20. Clearly, the doping concentration of the p⁻-type material portion 20b is chosen to be lower than the doping concentration of the n⁻-type material passage 22b of the region 22.

The provision of the p⁻type material portion 20b also avoids the need to increase the on-resistance of the p-type bulk material portion 20a, which, while increasing the breakdown voltage $B_V$, will also result in a higher threshold voltage $V_T$ and may render the device 10 incompatible with other devices. Therefore, to overcome the drop in breakdown voltage whilst maintaining the low on-resistance and low threshold voltage, the p⁻-type bulk region portion 20b is implanted. As mentioned previously, this is due to the fact that the p⁻-type channel region portion 20b is selected to be the lighter doped side of the pn junction and thus, determines the breakdown voltage.

The fabrication of a plurality of the metal oxide semiconducting devices 10 will now be described with reference to FIGS. 2 to 6. A p⁻-type substrate or silicon wafer 112 having a resistivity of 20 Ωcm has n⁻-type and p⁻-type epitaxial layers 114, 116 grown thereon, each of which has a thickness of 2.5 μm and a resistivity of 2 Ωcm. The epitaxial process which is well known in the art grows a thin single crystal silicon film from the gas phase of the existing crystal as a continuation of the existing crystal of the same material. By adding majority carrier impurities into the gas phase, different types of majority carrier semiconductive material (either n-type or p-type material) having varying resistivities can be grown on the substrate. Furthermore, by using this process, abrupt step $p^-/n^-$ and $n^-/p^-$ junctions 118 and 120 respectively are formed.

Figure 2:
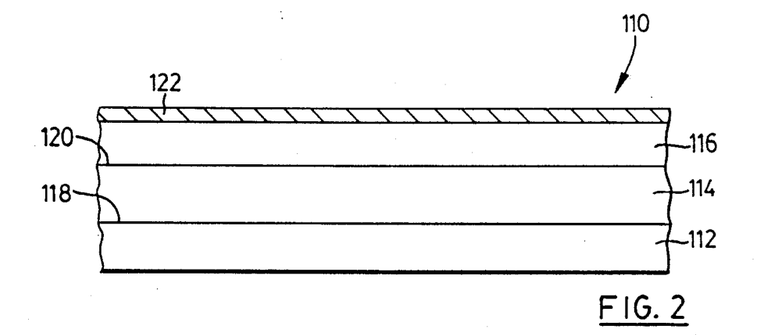
FIG. 2 is a cross-sectional view of a first intermediate form of a plurality of metal oxide semiconducting devices.
Figure 3:
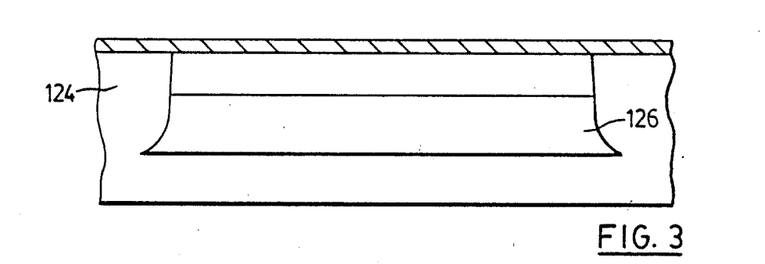
FIG. 3 is a cross-sectional view of a second intermediate form of a plurality of metal oxide semiconducting devices.

Following the growth stage, silicon oxide layer 122 is deposited on $p^-$-type layer 116 thereby forming a $p^-/n^-/p^-$ double epitaxial substrate 110. P+-type material isolation diffusions 124 are performed on substrate 110, which allow p+-type impurities to penetrate through both the $p^-$-type layer 116 and the $n^-$-type material layer 114 and reach the $p^-$-type material substrate 122, thereby defining an isolation island 126. Thereafter, a top n-type material drift region 128 is formed in $p^-$-type material layer 128 by bombarding layer 116 with a $2*10^{12}\text{cm}^{-2}$ concentration of phosphorous ions, a process commonly referred to as ion implantation.

Figure 4:
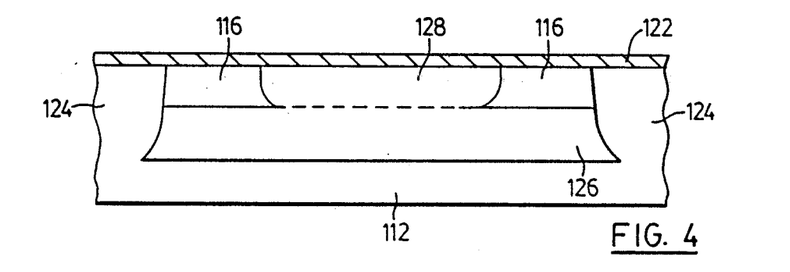
FIG. 4 is a cross-sectional view of a third intermediate form of a plurality of metal oxide semiconducting devices.
Figure 5:
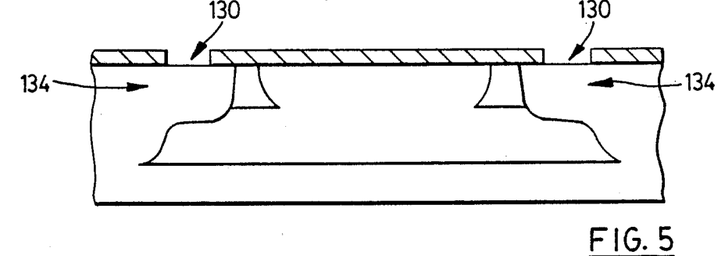
FIG. 5 is a cross-sectional view of a fourth intermediate form of a plurality of metal oxide semiconducting devices.

Following these processes, intermediate windows 130 are etched in silicon oxide layer 122 and second p-type isolation diffusions 134 are performed, thereby defining the channel region of the semiconducting device. A third intermediate window (not shown) is etched in the silicon oxide layer 122 and n+-type isolation diffusions 136, 138 and 140 are performed through the respective one of the three windows to form the source and the drain regions of the semiconducting devices. Thereafter, the three intermediate windows are filled leaving a complete silicon oxide layer 122 overlaying the intermediate form of the semiconducting devices.

Figure 6:
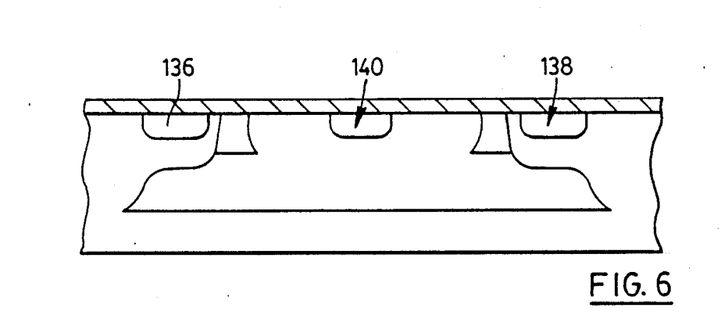
FIG. 6 is a cross-sectional view of a fifth intermediate form of a plurality of metal oxide semiconducting devices.

Next, intermediate gate windows (not shown) are etched in silicon layer 122 and thin silicon oxide layers 142 are grown therein in order to form the recesses 144 which secure the gate metal oxide layers to the semiconducting devices.

Figure 7:
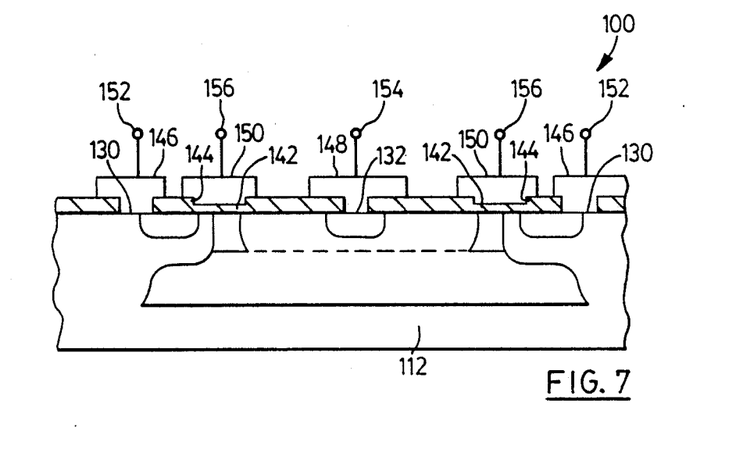
FIG. 7 is a cross-sectional view of a plurality of metal oxide semiconducting devices.

Contact windows 130 and 132 are etched in silicon layer 122 and the source and drain metal oxide layers 146 and 148 are defined thereover, whilst metal oxide layers 150 are defined over gate recesses 144. Lastly, the source, drain and gate terminals 152, 154 and 156 are connected to the respective one of metal oxide layers 146, 148 and 150, thereby resulting in two metal oxide semiconducting devices 100 formed on the single substrate 112.

The present technique used to manufacture these devices uses the combination of epitaxial growth with ion implantation. The resurf condition associated with epitaxial growth requires that $$N_D(Y)dy = F(N_A) = Q_{DT}$$

where $F(N_A)$ is a function of the substrate impurity $N_A$; $N_D(Y)$ is the vertical impurity distribution; and $Q_{DT}$ is the number of impurities per unit area in the epitaxial drift region.

This requirement sets the upper bound on the current capabilities and a lower bound on the on-resistance of the semiconducting device. Thus, to reduce on-resistance, $Q_{DT}$ must be increased and the resistivity in the major portion of the current path (drift region) must be minimized without lowering the breakdown voltage. The use of ion implantation as a doping method was found to be superior as a means of controlling $Q_{DT}$ when compared with the use of straight epitaxial drift layer control. Furthermore, the dopant location and profile was found not to affect the attainable breakdown voltage BV. Thus, a multiple resistivity drift region is obtained by combining epitaxy with ion implantation.

Figure 9:
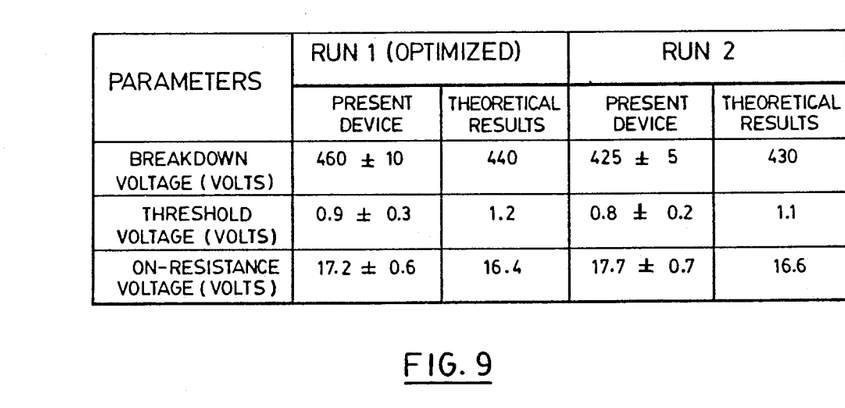
FIG. 9 is a comparison table for a number of semiconducting devices.

Referring now to FIG. 9, a chart is shown comprising theoretical results and test results for the present semiconducting device 10 when fabricated to exhibit a breakdown voltage equal to 450 volts. To attempt to exhibit a 450 volt breakdown voltage, the thickness of passages 22a and 22b were designed to be 2 μm and 4 μm, respectively, and the passage 22a was doped to have a resitivity of 2 Ωcm. Moreover, the source to gate metal separation was set to equal 20 μm and the effective drift regions and effective channel lengths were designed to equal 42 μm and 1.2 μm respectively. As can be seen, the present device 10 exhibits a higher breakdown voltage $B_V$ whilst maintaining a lower threshold voltage $V_T$ and a lower on-resistance $R_{on}$. Furthermore, the method of combining ion implantation and expitaxy allows the parameters to be controlled accurately as can be seen when comparing the test results with the theoretically calculated results. Thus, the breakdown voltage and on-resistance can be arbitrarily chosen to suit the requirements of the specific application by providing the proper amounts of doping in the channel region portions 20a and 20b and drift region passages 22a and 22b respectively.

Figure 10:
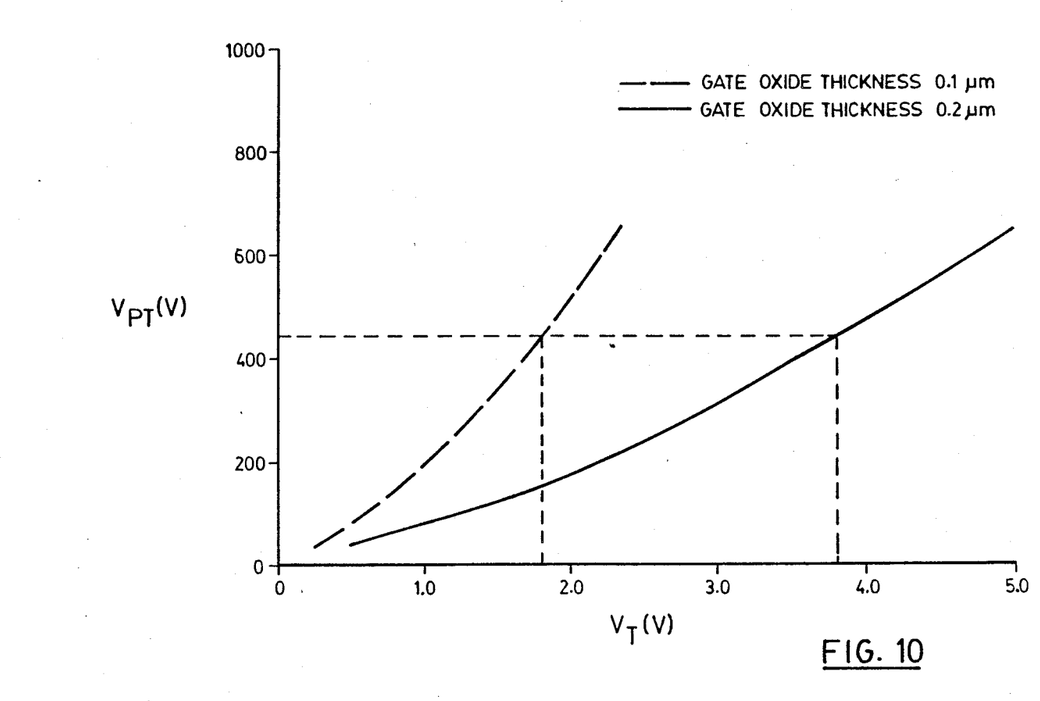
FIG. 10 is a performance curve for the device illustrated in FIG. 1.
Figure 11:
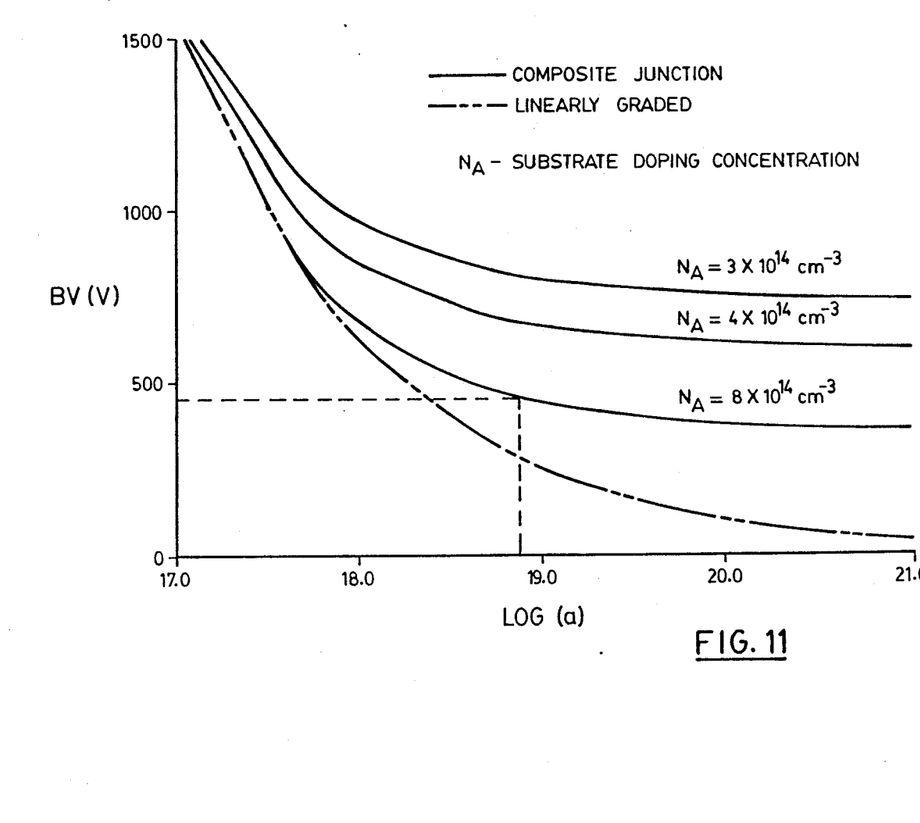
FIG. 11 is yet another performance curve for the device illustrated in FIG. 1.
Figure 12:
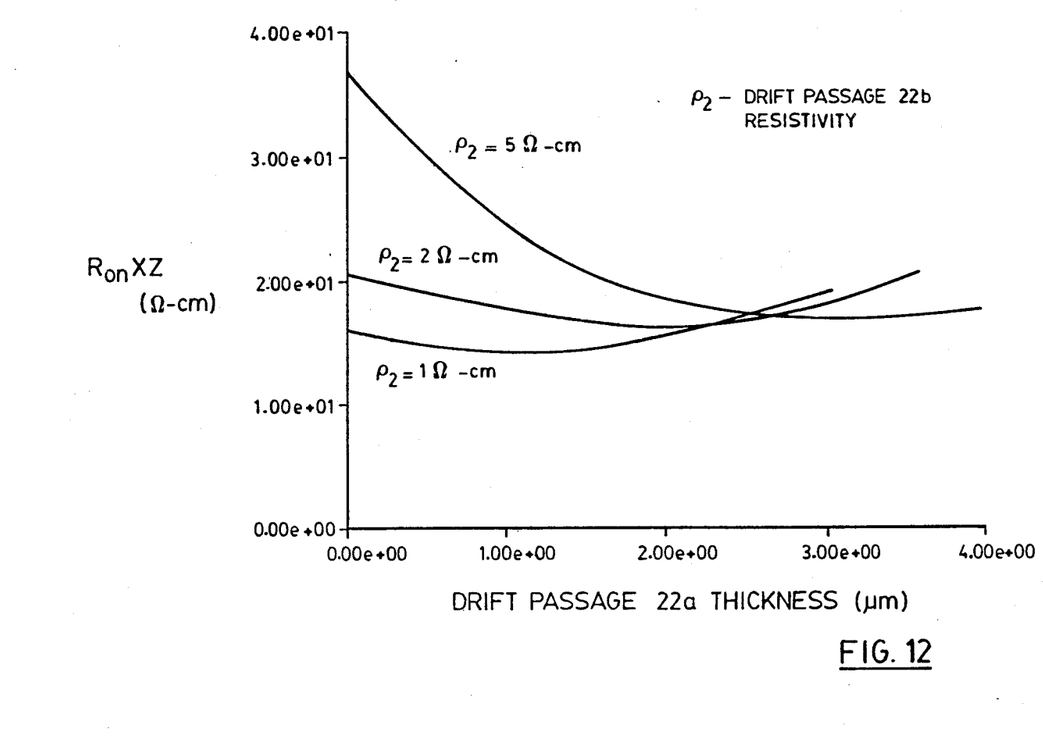
FIG. 12 is still yet another performance curve for the device illustrated in FIG. 1.

Referring now to FIGS. 10 to 12, a number of performance curves are shown illustrating variations of threshold voltage $V_T$, on-resistance $R_{on}$ and breakdown voltage BV in the semiconducting device 10 with respect to various parameters.

In particular, FIG. 10 shows threshold voltage $V_T$ versus punch-through voltage $V_{PT}$ for various thicknesses of gate oxide layer 36. As can be seen, for a breakdown voltage of 450 volts, a 2 volt threshold voltage is required when the thickness of the gate oxide layer 36 is 0.1 μm and a 3.5 volt threshold voltage is required when the gate oxide layer is 0.2 μm. Thus, to minimize the threshold voltage $V_T$, the thickness of the gate oxide 36 must be minimized. However, size constraints are encountered when trying to reduce greatly the thickness of the gate oxide layer 36.

FIG. 11 illustrates a comparison of the breakdown voltage of the semiconducting device 10 as a function of the impurity gradient $Q_{DT}$ for various substrate concentrations and junctions. As can be seen for a substrate concentration of $8 \times 10^{14}\text{cm}^{-3}$, the impurity gradient $Q_{DT}$ must be less than $1 \times 10^{19}\text{cm}^{-4}$ to maintain a breakdown voltage BV greater than 450 volts.

Lastly, FIG. 12 illustrates the on-resistance $R_{on}$ normalized to the drift channel width as a function of the implanted drift region passage 22a thickness for various drift region passage 22b resistivities. The reduction of the on-resistance $R_{on}$ is greater for high resistance layers, however, a larger p+type isolation depth is required.

From the comparison tables and performance curves illustrated it can be seen that the high voltage multiple resistivity drift region semiconducting device 10 demonstrates the features of minimizing on-resistance for a given breakdown voltage. This feature is achieved by using a properly doped ion implant drift region passage 22a and an epitaxial drift region passage 22b and a properly doped ion implant channel region portion 20b. Furthermore, the threshold voltage is maintained at a relatively low voltage by using a thin gate oxide layer 36.

Although the foregoing description solely discusses the operation of a npn metal oxide semiconducting device and the method for making the same, it should be noted that a pnp metal oxide semiconducting device can be grown on an $n^-$-type material substrate. To fabricate the pnp device, the method as previously described is implemented. However, all p-type material and all n-type material regions must be substituted for one another whilst maintaining the same doping concentrations in each region. If similar results to those achieved when using the npn MOS device are desired, additional silicon area will be required due to the hole mobility characteristics of p-type semiconductive material.

We claim:

1. A semiconducting device comprising:

gate, source and drain nodes disposed on one side of a semiconducting layer, said source and drain nodes being located on either side of said gate node;

an insulation layer disposed on the other side of said semiconducting layer, said semiconducting layer including a channel region located adjacent said gate node and being formed from one conductivity type of semiconductive material;

a drift region formed from the opposite conductivity type of semiconductive material, said drift region including a pair of parallel upper and lower conductive passages, one of said conductive passages having a lower doping concentration than the other of said conductive passages, said channel region including first and second zones, each of said zones being respectively adjacent one of said passages to define a pair of pn junctions, the doping concentration of each of said zones being chosen so that each of said pn junctions has a substantially similar breakdown voltage; and source and drain regions formed from said opposite conductivity type of semiconductive material, said source and drain regions being located adjacent said respective nodes and having a higher doping concentration than said other passage, said first zone being adjacent said source region and said second zone being disposed between said first zone and said upper passage.

2. The semiconducting device as defined in claim 1 wherein said upper passage has a higher doping concentration than said lower passage, and wherein said first zone has a higher doping concentration than said lower passage and wherein said second zone adjacent said upper passage has a lower doping concentration than said upper passage.

3. The semiconducting device as defined in claim 2 wherein said insulation layer is in the form of a substrate formed from said one conductivity type of semiconductive material and wherein said lower passage extends to isolate said channel region from said substrate.

4. The semiconducting device as defined in claim 3 wherein said one conductivity type of semiconductive material is semiconductive material having p-type impurities and said opposite conductivity type of semiconductive material, semiconductive material is semiconductive material having n-type impurities.

5. The semiconducting device as defined in claim 4 wherein said upper and lower passages have thicknesses of approximately 2 $\mu$m and 4 $\mu$m, respectively, and wherein said upper passage has a resistivity of approximately 2 $\Omega$ cm.

6. The semiconducting device as defined in claim 3 wherein said first and second zones are lateral double isolation diffusions.

7. The semiconducting device as defined in claim 3 wherein said lower passage is an epitaxial growth layer and said upper passage is an ion implantation layer.

8. The semiconducting device as defined in claim 3 wherein said one conductivity type of semiconductive material is semiconductive material having n-type impurities and said opposite conductivity type of semiconductive material is semiconductive material having p-type impurities.

9. The semiconducting device as defined in claim 3 wherein said source, gate and drain nodes includes an input terminal coupled with a metal oxide layer, said source and drain metal oxide layers being in contact with said source and drain regions respectively, and said gate metal oxide layer being separated from said semiconducting layer by an insulator.

10. The semiconducting device as defined in claim 9 wherein said insulator is a silicon oxide layer.

11. The semiconducting device as defined in claim 5 wherein said gate node includes a gate terminal and an insulator, said insulator isolating said terminal from said semiconducting layer, said insulator being in the form of a metal oxide layer and having a thickness in the range of 0.1 $\mu$m to 0.2 $\mu$m.

* * * * *